United States Patent
Yoshida et al.

(10) Patent No.: US 7,456,645 B2
(45) Date of Patent: Nov. 25, 2008

(54) INSPECTION COAXIAL PROBE AND INSPECTION UNIT INCORPORATING THE SAME

(75) Inventors: Takuto Yoshida, Tokyo (JP); Atsushi Sato, Tokyo (JP); Yasuo Fukushima, Gunma (JP); Masaki Noguchi, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 198 days.

(21) Appl. No.: 10/830,220

(22) Filed: Apr. 23, 2004

(65) Prior Publication Data

US 2004/0212381 A1 Oct. 28, 2004

(30) Foreign Application Priority Data

Apr. 25, 2003 (JP) ............................. 2003-121574

(51) Int. Cl.
*G01R 31/02* (2006.01)
(52) U.S. Cl. ........................ 324/761; 324/754
(58) Field of Classification Search ................ 324/754, 324/755, 761, 762; 439/482, 700, 824, 840, 439/841, 877, 66
See application file for complete search history.

(56) References Cited

U.S. PATENT DOCUMENTS

| | | | | |
|---|---|---|---|---|
| 4,931,726 A * | 6/1990 | Kasukabe et al. | ............ | 324/754 |
| 5,302,923 A | 4/1994 | Mason et al. | ................. | 333/33 |
| 5,410,260 A | 4/1995 | Kazama | ....................... | 324/758 |
| 5,534,787 A * | 7/1996 | Levy | ........................... | 324/761 |
| 5,990,697 A * | 11/1999 | Kazama | ....................... | 324/761 |
| 6,037,787 A * | 3/2000 | Corwith | ....................... | 324/754 |
| 6,102,709 A * | 8/2000 | Howard et al. | ................. | 439/66 |
| 6,655,983 B1 * | 12/2003 | Ishikawa et al. | ............ | 439/482 |
| 6,776,623 B1 | 8/2004 | Yunker et al. | ................. | 439/71 |
| 6,784,679 B2 * | 8/2004 | Sweet et al. | ................. | 324/761 |
| 6,844,749 B2 | 1/2005 | Sinclair | ....................... | 324/761 |
| 6,953,348 B2 * | 10/2005 | Yanagisawa et al. | .......... | 439/66 |

FOREIGN PATENT DOCUMENTS

| | | |
|---|---|---|
| JP | 03-085456 | 4/1991 |
| JP | 6-87874 | 12/1994 |
| JP | 8-111438 | 4/1996 |
| JP | A-2001-99889 | 4/2001 |
| JP | 2002-107408 | 4/2002 |

* cited by examiner

*Primary Examiner*—Ha Nguyen
*Assistant Examiner*—Roberto Velez
(74) *Attorney, Agent, or Firm*—Morgan, Lewis & Bockius LLP (57) ABSTRACT

A conductive block is formed with a first face, a second face and a through hole connecting the first face and the second face. A contact probe is provided with a conductive pipe and a conductive plunger, retractably provided in at a first end of the pipe, the plunger being to be brought into contact with a device to be inspected. A first retainer includes a first insulative member through which the first end of the pipe is retained in the vicinity of the first face of the block, such that the pipe is coaxially held within the through hole while forming a gap between an outer periphery of the pipe and an interior wall of the through hole.

2 Claims, 7 Drawing Sheets

INSPECTION COAXIAL PROBE AND INSPECTION UNIT INCORPORATING THE SAME

BACKGROUND OF THE INVENTION

The present invention relates to an inspection coaxial probe which establishes reliable connection between a device to be inspected and inspection equipment for inspecting an electrical characteristic of a module of high-frequency/high-speed circuitry (an analog high frequency is called a high frequency; a digital frequency dealing with a very short pulse width and a very short pulse interval is called high speed; and both frequencies are hereinafter collectively referred to as a radio frequency "RF"). Here, an RF encompasses an analog high frequency and a high-speed digital short pulse having a short pulse interval, wherein an iteration rate of a sinusoidal wave or pulses is 1 G H z or more.

For instance, the RF circuitry includes an amplification circuit or a mixer circuit, which are to be incorporated into, e.g., a portable cellular phone, or a filter circuit, or an IC. Such inspection is performed before the module or IC is incorporated into a circuit board.

More specifically, the present invention relates to a coaxial probe for use in inspecting an RF device which eliminates a necessity for soldering a device to be inspected; which can effect full electrical contact even at an RF range; and which can also establish connection with the device to be inspected through use of a coaxial structure, which is free from the influence of noise, even when electrode terminals of the device are arranged at a very narrow pitch of about 0.4 mm.

The present invention is also related to an inspection unit incorporating such a coaxial probe.

When an electrical characteristic of an RF device, such as a semiconductor wafer, an IC, or a module, is inspected, impedance will vary if, particularly, a contact condition of a terminal section is incomplete, which causes variations in a measured value. For this reason, inspection is performed through use of a jig such as that shown in FIG. 8. Specifically, in order to prevent interference of external noise, an RF circuit, which is a device to be inspected, is assembled into a module 50 by incorporating an amplification circuit and a mixer circuit into a metal housing. RF signal input and output terminals 51, 54, a power supply terminal 52, and a ground (earth) terminal 53 are provided on the back face of the housing. The RF circuit is inspected by electrically connecting the RF circuit to respective terminals of a wiring board 66 on which wiring for inspection purpose is laid.

Figure 8:
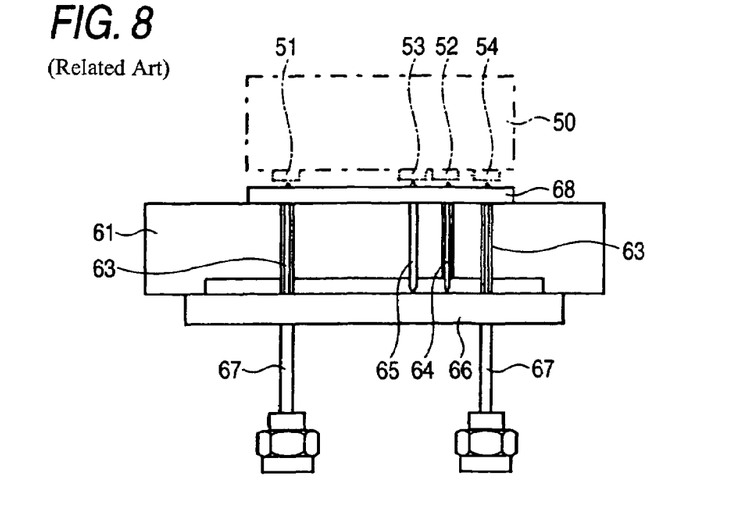
FIG. 8 is a section view of a first related-art inspection unit.

An example shown in FIG. 8 adopts the following configuration. Specifically, the configuration uses contact probes, wherein each contact probe is constituted by inserting a spring and one end of a plunger in a metal pipe such that the plunger is projected outwardly by the spring and such that the plunger is withdrawn when depressed. Electrode terminals are connected together by placing Rf signal contact probes 63, power supply contact probes 64, and earth contact probes 65 within a metal block 61 for preventing influence of external noise. In order to diminish an inductance component, the RF signal contact probe 63 is formed into a short probe having a length of, e.g., about 2 mm. Even in the case of such a short probe, difficulty is encountered in diminishing a reactance component of the probe to 1 nH or less at an RF range. For instance, the probe of 1 nH yields impedance of 63 Ω at 10 GHz.

Therefore, there is employed a coaxial structure in which a dielectric tube is interposed between the RF signal contact probe 63 and the metal block 61 and the contact probe 63 serves as a core conductor and the metal block 61 serves as an outer conductor, to thus prevent an increase in impedance or intrusion of noise (see, e.g., Japanese Patent Publication No. 2001-99889A). In FIG. 8, reference numeral 67 designates a coaxial cable; and 68 designates a support for retaining the metal pipe provided around an outer periphery of the contact probe.

Figure 9A:
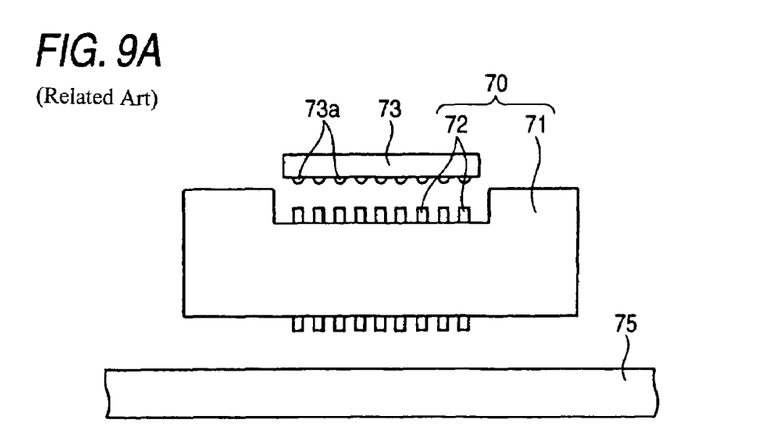
FIG. 9A is a schematic side view of a second related-art inspection unit.
Figure 9B:
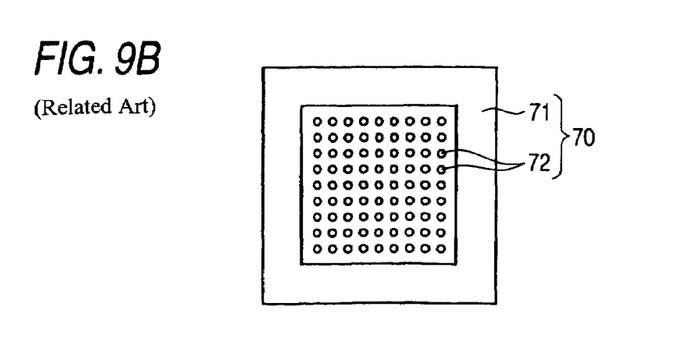
FIG. 9B is a plan view of the inspection unit shown in FIG. 9A.

Even when an IC is inspected lead terminals of an IC and a wiring board are connected together by way of an IC socket formed from a leaf spring. Alternatively, as shown in FIGS. 9A and 9B, an IC socket 70 is formed of a block 71 made of plastic or ceramic, and contact probes 72 are analogous to those mentioned previously and arranged in a matrix pattern in association with electrode terminals 73a of an IC 73. The IC 70 is connected to the wiring laid on a multilayer wiring board 75 by way of the IC socket 70.

As mentioned previously, probes to be connected with respective electrode terminals are covered with a metal block. Further, RF signal contact probes are constituted in the form of a coaxial line, thereby preventing occurrence of reflection or attenuation of an RF signal, which would otherwise be caused by a contact probe or intrusion of external noise or delivery of noise to other electrode terminals. Thus, a jig for inspecting an RF device is constituted. FIG. 8 shows two RF signal contact probes 63 (for input and output), one power supply contact probe, and one earth contact probe, however, all the probes are actually formed in a large number. Further, in association with a recent increase in the degree of integration of an IC, there is a case where electrode terminals having an area of about 600/cm$^2$ are provided in a matrix pattern. An IC having electrode terminals arranged at a narrow pitch of about 0.4 mm has come into existence.

In order to achieve predetermined impedance by the coaxial structure such as that mentioned previously, an outer diameter "d" of the contact probe serving as a core conductor and an inner diameter "D" of a hole of the metal block serving as an outer conductor must satisfy the relationship expressed by Equation (1) provided below, while a relative dielectric constant of a dielectric substance interposed between the core conductor and the outer conductor serves as $\epsilon_r$.

$$Zo = \frac{60}{\sqrt{\epsilon_r}} \log_e \frac{D}{d} \qquad (1)$$

Therefore, even when an attempt is made to realize a coaxial structure having an impedance of 50 Ω through use of a tube formed from polytetrafluoroethylene, which is known as a dielectric having a small relative dielectric constant on the order of 2.1, the inner diameter D of the hole formed in the metal block must be about 3.3 times as large as the outer diameter "d" of the contact probe. Thus, the contact probes may fail to be compatible with a device to be inspected which has a narrow pitch of about 0.4 mm or less, unless the outer diameter "d" of the contact probe is reduced to 0.1 mm or less.

However, the contact probe has a structure in which a spring and a plunger are inserted into a metal pipe. If the outer diameter of the contact probe is reduced excessively, the contact probe becomes very costly. Further, there is an anxiety that durability and reliability of the contact probe are lowered.

SUMMARY OF THE INVENTION

It is therefore an object of the present invention to provide a coaxial probe for inspecting an RF device which can per-form highly reliably inspection without being affected by noise, through use of inexpensive contact probes of coaxial structures even when a recent RF device having electrode terminals arranged at a very small pitch is inspected. It is also an object of the present invention to provide a specific retainer which can tightly retain contact probes in the centers of respective insertion holes, thereby reducing a ratio of the inner diameter to the outer diameter of the coaxial structure and making an attempt to render the coaxial structure compact.

It is also an object of the present invention to provide an inspection unit using such coaxial probes.

In order to achieve the above objects, according to the invention, there is provided an inspection coaxial probe, comprising:

a conductive block, formed with a first face, a second face and a through hole connecting the first face and the second face;

a contact probe, comprising:

a conductive pipe; and a conductive plunger, retractably provided in at a first end of the pipe, the plunger being to be brought into contact with a device to be inspected; and a first retainer, comprising a first insulative member through which the first end of the pipe is retained in the vicinity of the first face of the block, such that the pipe is coaxially held within the through hole while forming a gap between an outer periphery of the pipe and an interior wall of the through hole.

With such a configuration, an air layer can be defined between the contact probe and the metal block over the majority of the length of the contact probe. Consequently, the relative dielectric constant $\epsilon_r$ of the dielectric substance in Equation (1) can be deemed to be substantially 1. Even when the coaxial structure is imparted with an impedance of 50 Ω, the only requirement is to render the inner diameter of the through hole 2.3 times as large as the outer diameter of the contact probe. Even in the case of a device to be inspected having a pitch of 0.4 mm between electrode terminals, a coaxial structure of 50 Ω can be constituted of a contact probe having an outer diameter of 0.15 mm and a through hole having an inner diameter of 0.35 mm.

Preferably, the first insulative member is a substrate provided on the first face of the block, and formed with a recess and a through hole communicated with the recess. The first end of the pipe is fitted into the recess such that the plunger coaxially extends through the through hole of the substrate.

With such a configuration, the contact probe can be retained while the end of the pipe is retained firmly through use of the insulative substrate possessing mechanical strength; e.g., polyetherimide (PEI) having a thickness of about 1 mm. As a result, movement of the contact probe or occurrence of warpage in the insulative substrate can be prevented. Further, even when the gap is defined between the contact probe and the interior wall of the through hole, an accurate coaxial characteristic can be maintained. In this case, no coaxial configuration is established within the thickness portions of the insulative substrates. However, as will be described later, absence of a coaxial structure poses little influence at a frequency of 10 GHz or less. Return loss assumes a value of −20 dB or less at a frequency of about 10 GHz or less. Hence, there is no practical problem.

Preferably, a first end portion of the through hole of the block is narrowed. The first insulative member is a spacer formed with a recess and a through hole communicated with the recess. The first insulative member is inserted into the first end portion of the through hole and the first end of the pipe is fitted into the recess, such that the plunger coaxially extends through the through hole of the spacer and the through hole of the substrate.

With such a configuration, since the contact probe is fixed by the block by way of the insulative spacer, high mechanical strength can be secured. Further, even when the number of coaxial probes is extremely large, the probes can be fixed without involvement of the warpage problem.

Preferably, the inspection coaxial probe further comprises a conductive plate, formed with a first recess and a first through hole communicated with the first recess, the plate being provided on the first face of the block. The first insulative member is a spacer formed with a second recess and a second through hole communicated with the second recess. The first insulative member is inserted into the first recess and the first end of the pipe is fitted into the second recess, such that the plunger coaxially extends through the first through hole, the second through hole and the through hole of the block.

With such a configuration, the contact probe can be fixed by attaching only the plate on the surface of the block by way of the insulative spacer. There is no necessity for inserting the contact probes into the narrowed portion formed in the block by way of the insulative spacers. Hence, the coaxial probe can be assembled very easily but can attain the same mechanical strength as that achieved when the contact probe is inserted into the narrowed portion.

Preferably, the inspection coaxial probe further comprises a second retainer, comprising a second insulative member through which a second end of the pipe is retained in the vicinity of the second face of the block. The contact probe is electrically connected to a wiring board on which an inspection circuit is provided via the second end of the pipe.

Here, it is preferable that a first recess is formed on the second face of the block. The second insulative member is a spacer formed with a second recess and a through hole communicated with the second recess. The spacer is fitted into the first recess and the second end of the pipe is fitted into the second recess, such that the second end of the pipe is electrically connected to the wiring board via the through hole of the spacer, while the spacer is held by the wiring board within the first recess.

According to the invention, there is also provided an apparatus for inspecting an electrical characteristic of a device, the apparatus comprising:

the above inspection coaxial probe; and a wiring board, on which an inspection circuit is provided, and to which a second end of the pipe is electrically connected.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE INVENTION

Preferred embodiments of the invention will be described below in detail with reference to the accompanying drawings.

Figure 1A:
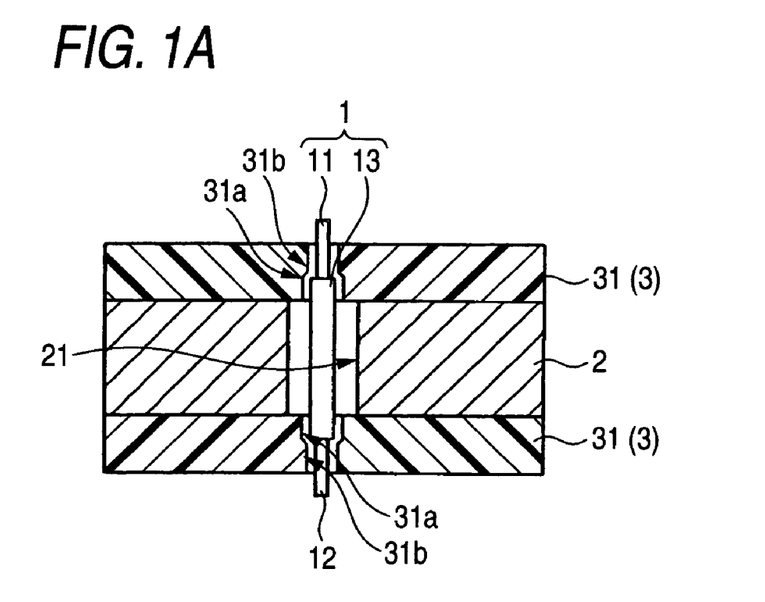
FIG. 1A is a section view of an inspection coaxial cable according to a first embodiment of the invention.
Figure 1B:
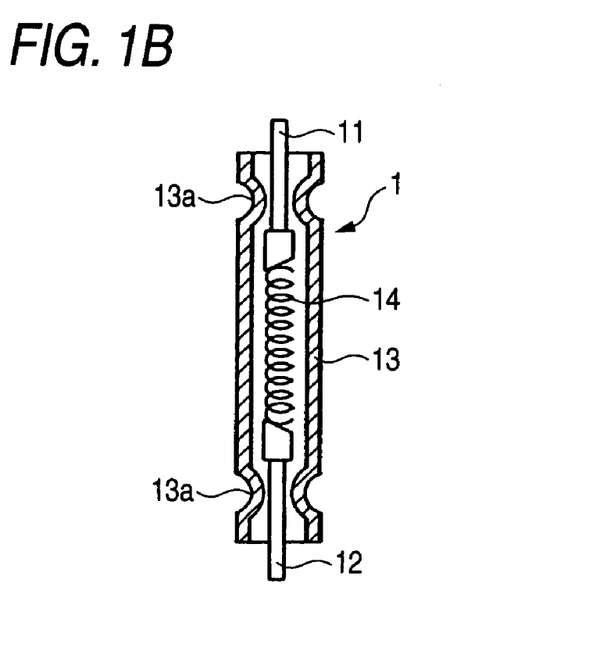
FIG. 1B is a section view of a contact probe incorporated in the inspection coaxial cable shown in FIG. 1A.

As shown in FIGS. 1A and 1B, an inspection coaxial probe according to a first embodiment of the invention comprises contact probes 1 inserted in respective insertion holes 21 of a metal block 2. The contact probe 1 is provided with a spring 14 and plungers 11, 12, all being inserted in a metal pipe 13. It is configured that the length of at least one of the plungers 11 and 12 projected from the metal pipe 13 can be adjusted. The inspection coaxial probe is provided with a retainer 3 for retaining each of the contact probes 1 in the metal block 2 by way of an insulator (an insulative substrate 31 in the embodiment shown in FIGS. 1A and 1B) which retains an end section of the metal pipe 13 substantially concentric with the respective insertion hole 21. An outer diameter of the metal pipe 13 and an inner diameter of the insertion hole 21 are set such that there is formed a coaxial structure of predetermined impedance, while each of the contact probes 1 serves as a core conductor and the metal block 2 serves as an outer conductor. Although the drawing is illustrated as if a large gap is present between the insulative substrate 31 and the end section of the metal pipe 13, the insulative substrate 31 and the metal pipe 13 are almost fitted together actually.

As shown in FIG. 1B, the contact probe 1 has a structure in which the spring 14 and one end of each of the plungers (movable pins) 11, 12 are housed within the metal pipe 13. Recessed sections 13a formed in the metal pipe 13 prevent the plungers 11, 12 from being dislodged from the metal pipe 13. The plungers 11, 12 are forced outwardly by the spring 14. The spring 14 contracts and is compressed into the metal pipe 13 when the extremities of the plungers 11, 12 are pressed, and the extremity of the plunger 11 projects to, e.g., about 1 mm, when no force is exerted on the contact probe 1.

In this embodiment, the plungers 11, 12 are provided at respective ends of the metal pipe 13. However, any structure is allowable, so long as at least one side of the contact probe 1 which is to contact a device to be inspected is provided with a plunger. The metal pipe 13 assumes a length of about several millimeters and is formed from, e.g., white metal (e.g., an alloy consisting of copper, nickel, and zinc). A wire having a diameter of about 0.1 mm formed from, e.g., an SK material (carbon tool steel material) or a beryllium copper alloy is used for the plungers 11, 12, and the spring 14 is formed from piano wire.

The metal block 2 is for retaining the contact probes 1, such as contact probes for an RF signal or contact probes for use with power supply terminals, which are to be brought into contact with the electrode terminals of an IC or module which is a device to be inspected. For instance, the contact probe 1 can be constituted in a coaxial structure through use of a metal body, such as aluminum, wherein an interior wall of the insertion hole 21 into which the contact probe 1 is inserted serves as an outer conductor and the contact probe 1 serves as a core conductor.

Figure 6A:
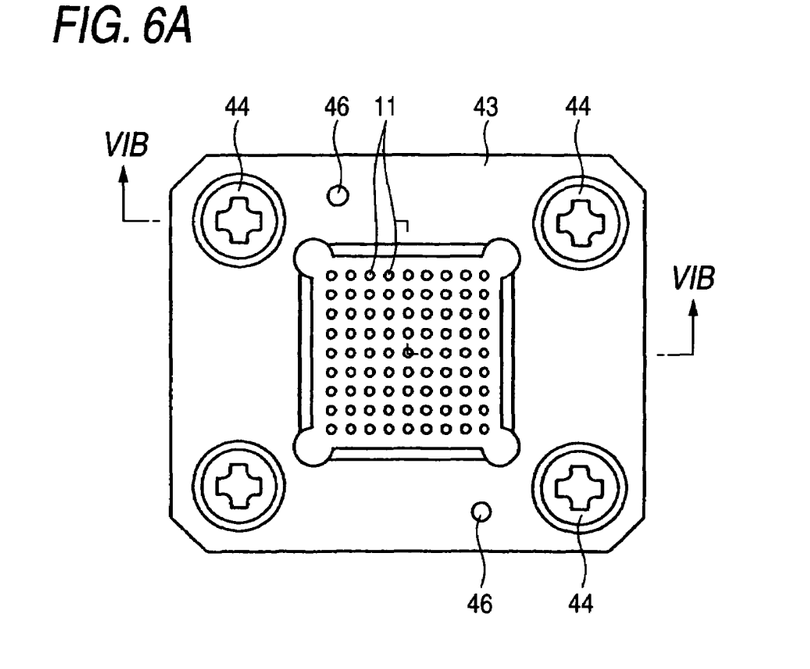
FIG. 6A is a plan view of an inspection unit incorporating the inspection coaxial cable of the invention.
Figure 6B:
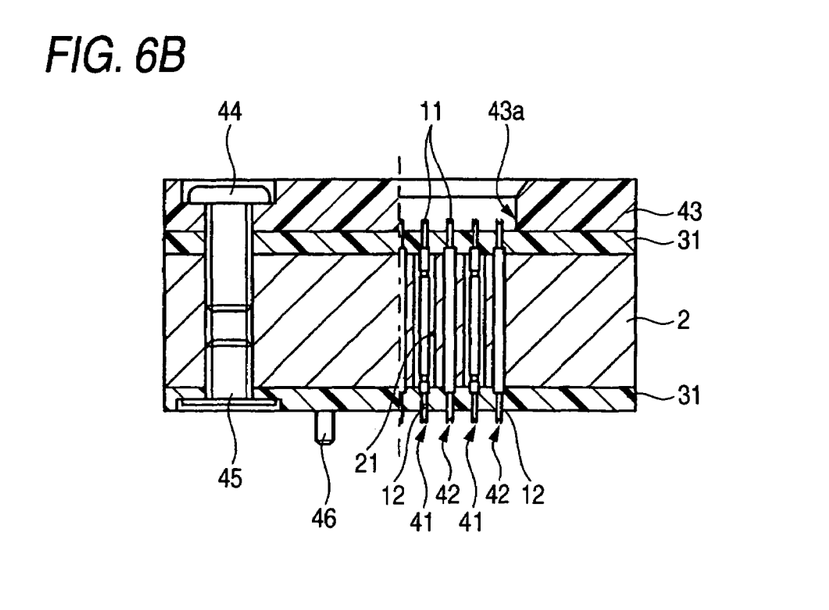
FIG. 6B is a section view taken along a line VIB-VIB of FIG. 6A.

The inner diameter of the insertion hole 21 is determined so as to yield predetermined impedance on the basis of Equation (1) in consideration of the outer diameter of the contact probe 1 and a dielectric constant of a dielectric substance interposed between the insertion hole 21 and the contact probe 1. When the probe is used as a signal probe for use with a DC or low-frequency signal or the probe is used as a power supply probe, the coaxial structure does not need to be adjusted to specific impedance, such as 50 Ω. The drawing shows that the metal block 2 is provided with only one contact probe 1. However, in an actual inspection unit, the metal block 2 is provided with a plurality of contact probes as shown in FIGS. 6A and 6B, which will be described later.

The thickness and size of the metal block 2 varies according to a purpose; for example, an IC socket used for merely coupling an IC to an inspection board having wiring laid thereon, or an inspection jig to be connected to a board connected to a coaxial cable or the like. However, the metal block 2 usually assumes a thickness of about 3 to 8 mm and a size of about 30 to 50 mm per side.

The retainer 3 is for retaining the contact probe 1 almost concentrically with the insertion hole 21 of the metal block 2. In this embodiment, the retainer 3 is formed from insulative substrates 31 provided on both main surfaces of the metal block 2. Specifically, each of the insulative substrates 31 has a recessed section 31a conforming in shape to the end section of the metal pipe 13, and a through hole 31b for permitting penetration of the plunger concentrically with the recessed sections 31a. Each of the insulative substrates 31 has a structure in which the insulative substrate 31 is fixed to the metal block 2 by unillustrated screws such that the recessed section 31a becomes concentric with the insertion hole 21 of the metal block 2.

Accordingly, the contact probe 1 is aligned with the center axis of the insertion hole 21. Since the through holes 31b through which the plungers 11, 12 penetrate are formed in the respective insulative substrates 31, the plungers 11, 12 project from the surfaces of the insulative substrates 31. When being pressed by the device to be inspected, the plungers 11, 12 are depressed to the surfaces of the insulative substrates 31, whereupon reliable contact can be established between electrode terminals of the inspected device and wiring patterns of a wiring board.

If an insulative substrate formed from resin; e.g., polyetherimide (PEI), is used as the insulative substrate 31, the recessed sections 31a and the through holes 31b can be more readily formed through resin molding and in accurate dimensions, even when the plurality of contact probes 1 are arranged at narrow pitches. For this reason, the insulative substrate formed from resin is preferable as material of the insulative substrate 31. Further, if the insulative substrates 31 are formed from the above resin, the substrates possess high mechanical strength. If the insulative substrates 31 are each formed to a thickness of about 1 mm, no warpage will arise and contact probes can be secured very stably, even when hundreds of contact probes or more are provided in the insulative substrates 31. However, another material may also be employed, so long as the material is thin and exhibits an electrical insulative characteristic and sufficient mechanical strength.

Since the insulative substrates 31 serving as the retainer 3 are constituted in the manner mentioned previously, so long as the outer diameter of each of the metal pipes 13 and the inner diameter of each of the insertion holes 21 have been set beforehand in accordance with Equation (1), the inspection coaxial probes can be readily formed, by fitting the extremities of the metal pipes 13 into the recessed sections 31a of the insulative substrates 31 and securing the insulative substrates 31 on the metal block 2 through use of screws, even when a plurality of contact probes 1 are arranged in the form of an array.

Figure 2:
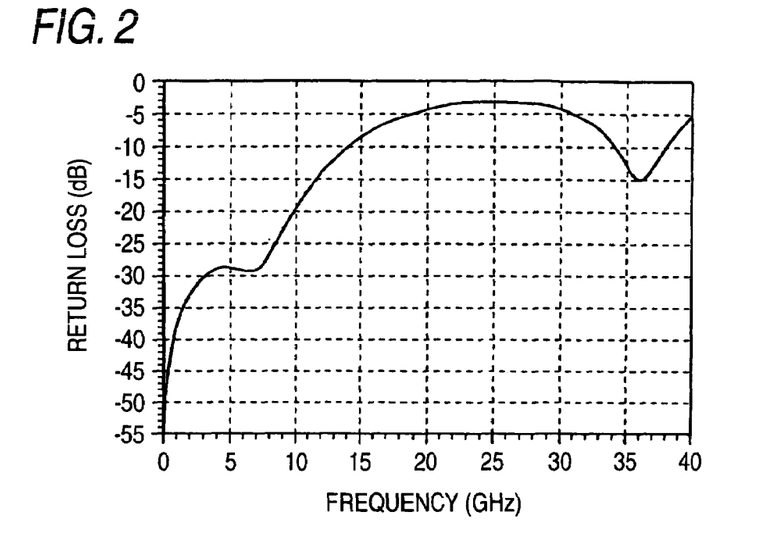
FIG. 2 is a graph showing a return loss characteristic of the coaxial probe shown in FIG. 1 achieved at various frequencies.

In this embodiment, the insulative substrates 31 are formed to a thickness of about 1 mm. Since the portions of the contact probes 1 corresponding to the insulative substrates 31 are not formed in a coaxial structure, none of the contact probes is formed in a coaxial structure over the entire length thereof. However, in a case where a coaxial probe was formed such that the contact probes 1 are provided at a pitch of 0.5 mm; the outer diameter of the metal pipe 13 is set to 0.15 mm; and the inner diameter of the insertion hole 21 is set to 0.35 mm, to thus form the contact probes in a coaxial structure having a characteristic impedance of 50 Ω, return loss generated by the coaxial probe at frequencies was examined through simulation. As shown in FIG. 2, the return loss assumes a value of −20 dB or less at a frequency of about 10 GHz or less. Hence, there was no practical problem.

In the above case, since the inner diameter of each of the insertion holes 21 is set to 0.35 mm, sufficient mechanical strength can be achieved even if the coaxial cables are arranged adjacent to each other at a pitch of 0.4 mm.

Figure 3A:
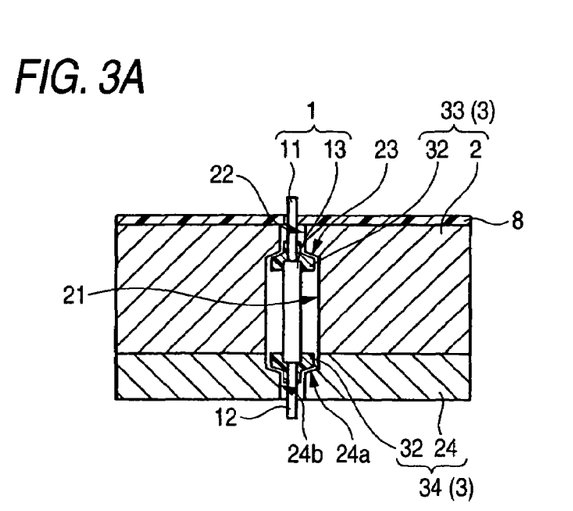
FIG. 3A is a section view of an inspection coaxial cable according to a second embodiment of the invention.

FIG. 3A shows an inspection coaxial probe according to a second embodiment of the invention. The members similar to those in the first embodiment will be designated by the same reference numerals, and the repetitive explanations will be omitted.

In this embodiment, the structure of an upper portion of the contact probe 1 (i.e., the structure of a portion of the contact probe 1 where the plunger 11 is provided) is provided with a narrowed section 23 communicated with a through hole 22 through which the plunger 11 penetrates. A retainer 33 is constituted of the metal block 2 having the narrowed section 23 formed therein, and an insulative spacer 32 interposed between the narrowed section 23 and the end of the metal pipe 13. The through hole 22 is formed in sufficient size so as not to contact the plunger 11.

Figure 3B:
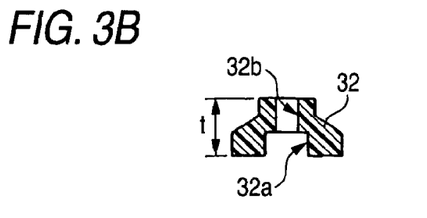
FIG. 3B is a section view of an insulative spacer incorporated in the inspection coaxial cable shown in FIG. 3A.

The insulative spacers 32 are formed from, e.g., polyetherimide. As shown in FIG. 3B, the outer dimension of the insulative spacer 32 is brought in conformance with the shape of the insertion hole 21 and that of the narrowed section 23. A recessed section 32a which enables insertion of the end section of the metal pipe 13 is formed in the center of one side of the insulative spacer 32. Further, a through hole 32b which enables penetration of the plunger 11 is formed in the center of the recessed section 32a, and the thickness "t" of the insulative spacer 32 is about 0.5 mm.

In FIG. 3A, reference numeral 8 designates an insulation film which is formed from, e.g., a polyimide film, and has a thickness of about 0.1 mm. The insulation film 8 is provided for preventing occurrence of, e.g., a short circuit, which would otherwise be caused when electrode terminals of the device to be inspected, such as an IC, come into contact with the metal block 2. If no such potential risk is present, the insulation film does not need to be provided, regardless of the retainer 33.

A retainer 34 is provided on a lower portion of the contact probe 1 shown in FIG. 3A (i.e., a portion of the contact probe 1 where the plunger 12 is provided). Specifically, the structure is achieved by setting the thickness of the metal block 2 to an extent to which the end section of the metal pipe 13 becomes exposed, and additionally forming a recessed section 24a and a through hole 24b in a metal cover 24 (both being identical in shape with the narrowed section 23 and the through hole 22). The metal cover 24 is fixed to the metal block 2 with unillustrated screws by way of the dielectric spacer 32 having the same shape as that of the upper retainer. The retainer 34 is constituted of the spacer 32 having the predetermined recessed section 32a and the through hole 32b formed therein, and the metal cover 24 having the predetermined recessed section 24a and the through hole 24b formed therein.

An insulative film may be provided on the metal cover 24 as in the upper portion of the metal block 2. However, in this embodiment, such an insulative film is omitted because, in many cases, the surface (i.e., the lower surface in the drawing) of the metal cover 24 is connected to a wiring board formed by stacking a plurality of films provided with wiring to be connected to inspection equipment, and earth conductors are provided on the surface of the wiring board exclusive of connected sections.

Since there is a necessity for inserting the contact probe 1 into the insertion hole 21, at least one end of each of the insertion holes formed in the metal block 2 must be opened. Therefore, the previously-described narrowed section 23 cannot be formed on both ends of each insertion hole 21. Therefore, as shown in FIG. 3A, the other end of each of the insertion holes must be given a structure in which the metal block 2 is divided into two sub-sections and one of the sub-sections is used as the metal cover 24 for covering the remaining part of the sub-section.

In such a configuration, the recessed sections 24a can be formed easily and inexpensively. Therefore, the metal block 2 may be constituted in a three-layer structure, and there can be formed the retainer 34 which fix both upper and lower end sections of the insertion hole 21 through use of a pair of sets each consisting of the metal cover 24 and the insulative spacer 32.

Further, since the retainers 33, 34 are constituted of the insulative spacer 32 and metal, such as the metal block 2 or the metal cover 24, the contact probes can be secured with a smaller thickness and greater strength than those achieved by only the insulative substrates 31 in the first embodiment.

Figure 4:
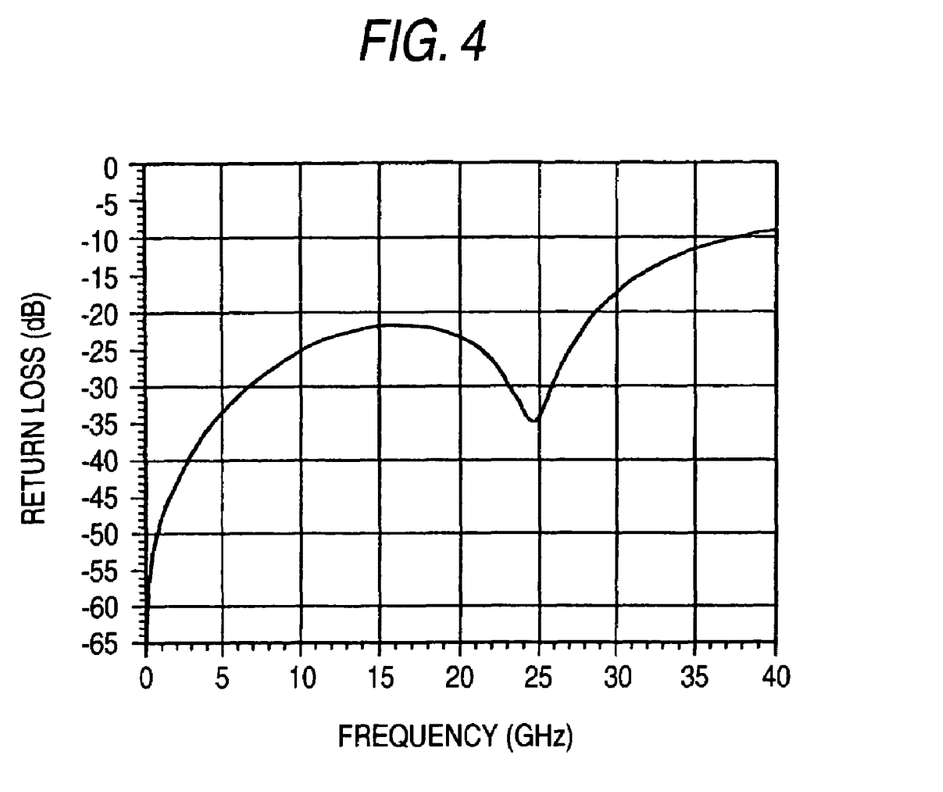
FIG. 4 is a graph showing a return loss characteristic of the coaxial probe shown in FIG. 3A achieved at various frequencies.

For instance, under the assumption that the load exerted on one contact probe is 10 gf and 1000 contact probes are provided, a spring pressure of 10 kgf in total is exerted on the retainer. However, even in such a case, the retainer can sufficiently retain the contact probes. Moreover, metal exists in the neighborhood of the holes through which the plungers 11, 12 penetrate, and portions of the contact probe establishing a coaxial structure are relatively long. Therefore, as can be seen from results of examination of the return loss shown in FIG. 4, the return loss being yielded by the coaxial probe at frequencies through simulation analogous to those shown in FIG. 2, a frequency range at which a return loss of −20 dB or less extends up to 28 GHz.

Figure 5A:
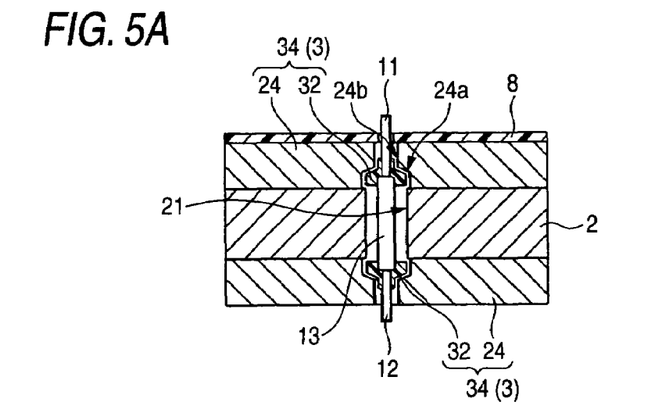
FIG. 5A is a section view of an inspection coaxial cable according to a third embodiment of the invention.

FIG. 5A shows an inspection coaxial probe according to a third embodiment of the invention. The members similar to those in the first embodiment will be designated by the same reference numerals, and the repetitive explanations will be omitted.

In this embodiment, the metal cover 24 is provided on either side of the metal block 2, so that the metal block 2 has a three-layer structure as described the above. The retainer 34 is formed in each of the metal covers 24 along with the insulative spacer 32. Moreover, the inner diameter of the recessed section 24a formed in the metal cover 24 is set so as to become greater than the inner diameter of the insertion hole 21 formed in the metal block 2. The outer diameter of the insulative spacer 32 is formed so as to become substantially identical with the inner diameter of the insertion hole 21. In other words, the diameter of the retainer 34 is slightly larger than that in the second embodiment. For instance, the diameter of the contact probe 1 assumes a value of 0.15 mm and the inner diameter of the insertion hole 21 assumes a value of 0.35 mm, and the inner diameter of the recessed section 24a is formed so as to become larger than the inner diameter of the insertion hole 21 by about 0.15 mm.

In such a configuration, there can be maintained the diameter of the coaxial outer conductor which becomes optimum as a result of insertion of a dielectric substance (the insulative spacer 32), thereby enabling an improvement in high-frequency characteristic.

Figure 5B:
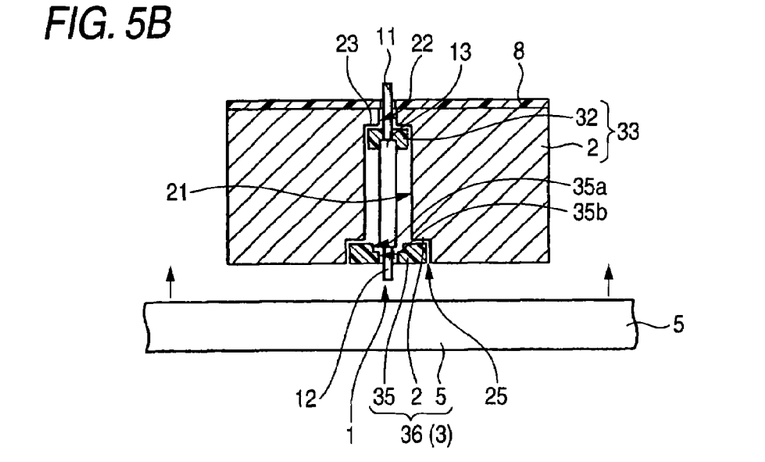
FIG. 5B is a section view of an inspection coaxial cable according to a fourth embodiment of the invention.

FIG. 5B shows an inspection coaxial probe according to a fourth embodiment of the invention. The members similar to those in the first embodiment will be designated by the same reference numerals, and the repetitive explanations will be omitted.

In this embodiment, the retainer 33 provided in the upper portion of the metal block 2 is identical with that in the second embodiment. Specifically, the retainer 33 is constituted of the metal block 2 having the narrowed section 23, and the insulative spacer 32.

On the other hand, a recessed section 25, which is larger in inner diameter than the insertion hole 21, is formed in the surface of the metal block 2 located at the lower end section of the insertion hole 21. A dielectric spacer 35 is inserted into one end section of the contact probe 1 and the recessed section 25 of the metal block 2. The dielectric spacer 35 has a recessed section 35a whose diameter conforms to the outer diameter of the extremity of the metal pipe 13, and a through hole 35b through which the plunger 12 penetrates concentrically with the recessed section 35a.

Since the dielectric spacer 35 is not fixed in this state, the contact probe 1 is not fixed either. However, the metal block 2 is usually fixed with screws while a lower portion of the metal block 2 remains in contact with the wiring board 5 formed from multiple layers. As a result of the metal block 2 being fastened to the wiring board 5, the dielectric spacer 35 is fixed firmly, and the contact probe 1 is also fixed concentrically with the insertion hole 21. In this embodiment, a retainer 36 is constituted of the metal block 2 having the recessed section 25; the dielectric spacer 35 having the recessed section 35a and the through hole 35b; and the wiring board 5.

With such a configuration, the contact probe 1 can be fixed concentrically with the insertion hole 21 by only the metal block 2, the insulative spacer 32, and the dielectric spacer 35. Fixing of the contact probe 1 can be achieved with use of a smaller number of components, while reducing a non-coaxial portion. In this case, impedance mismatch can be corrected by adjusting the depth and inner diameter of the recessed section 25. Consequently, there is yielded a merit of the ability to inexpensively manufacture a high-performance coaxial probe.

Figure 5C:
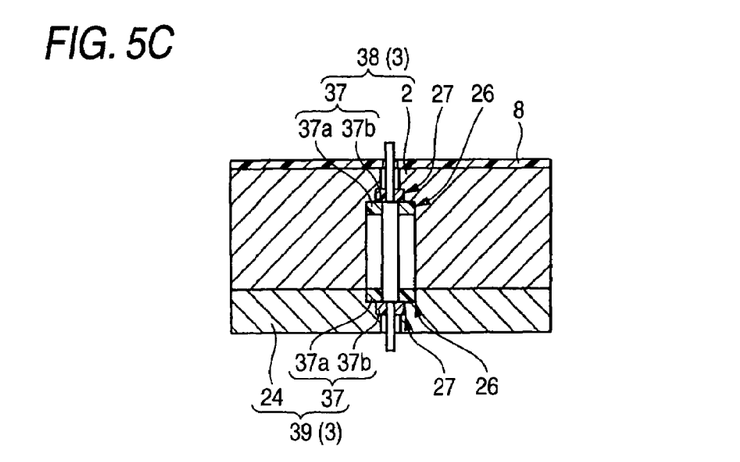
FIG. 5C is a section view of an inspection coaxial cable according to a fifth embodiment of the invention.

FIG. 5C shows an inspection coaxial probe according to a fifth embodiment of the invention. The members similar to those in the first embodiment will be designated by the same reference numerals, and the repetitive explanations will be omitted.

In this embodiment, an insulative spacer 37 to be used for retaining the contact probe 1 is constituted of a first spacer 37a provided around the metal pipe 13 of the contact probe 1, and a second spacer 37b provided around each of the plungers 11, 12. Further, a retainer 38 is constituted of the metal block 2 in which steps 26, 27 corresponding to the spacers 37a, 37b are formed, and a retainer 39 is constituted of the metal cover 24 in which similar steps 26, 27 are formed.

With such a configuration, the insulative spacer 37 can be formed in a simple ring shape. Different materials can be used for the two rings. Specifically, the only requirement for the first spacer 37a is to ensure concentricity between the contact probe 1 and the insertion hole 21, and the first spacer 37a does not require much mechanical strength. Therefore, the first spacer 37a can be formed from polytetrafluoroethylene having a small dielectric constant and a thickness of about 0.3 mm. As in the third embodiment, the influence of impedance mismatch can be inhibited without involvement of an increase in the diameter of the insulative spacer.

The second spacer 37b is for ensuring the longitudinal position of the contact probe 1. The contact probe 1 is fixed by the surface of the second spacer 37b contacting the end face of the metal pipe 13, and another surface of the same contacting the metal block 2 or the metal cover 24. Since the longitudinal force of the contact probe 1 is large, the contact probe 1 can be sufficiently retained through use of polyetherimide (PEI) having high mechanical strength and a thickness of about 0.3 mm. Since PEI has a high dielectric constant, and the inner diameter of an outer conductor must be larger than the outer diameter of the core conductor of the coaxial structure. However, the core conductors are the narrow plungers 11, 12 and have high dielectric constants. Hence, it is preferable for the dielectric constant and the outer diameter of the second spacer 37b to be larger, because a contact area between the second spacer 37b and the metal block 2 or a contact area between the second spacer 37b and the metal cover 24 can be made large, so that the second spacer 37b can retain the contact probe 1 tightly.

In this embodiment, the first spacer 37a has the same diameter as that of the insertion hole 21. However, the first spacer 37a may be given a diameter slightly larger than that of the insertion hole 21 and is press-fitted into the insertion hole 21. Since no longitudinal force is exerted on the first spacer 37a, the contact probe can be retained sufficiently. As a matter of course, impedance matching in accordance with Equation (1) can be achieved between the coaxial structures, by making the inner diameter of the step 26 slightly larger than the inner diameter of the insertion hole 21, as in the third embodiment, thereby enhancing the high-frequency characteristic and forming a space to be used for retaining the first spacer 37a.

As mentioned above, according to the coaxial probe of the present invention, the contact probe 1 is fixed in the insertion hole 21 formed in the metal block 2 with a gap between the outer wall of the contact probe 1 and the inner wall of the insertion hole 21 so as to establish the coaxial structure constituted of the core conductor and the outer conductor by way of the dielectric substance having a relative dielectric constant $\epsilon_r$ of nearly one.

Impedance of 50 Ω can be achieved, by making the inner diameter of the outer conductor about 2.3 times as large as the outer diameter of the core conductor. Consequently, a coaxial structure can be formed through use of a contact probe 1 having an outer diameter of about 0.15 mm even when the pitch between electrode terminals is about 0.4 mm. Therefore, a coaxial probe capable of performing inspection can be obtained inexpensively without involving occurrence of a loss, which would otherwise be caused by the inductance of a connected section.

Next, an inspection unit for inspecting a device through use of the above coaxial probe will be described with reference to FIGS. 6A through 7B. An IC socket for inspecting an IC or a module circuit is exemplified.

The inspection unit is provided with RF signal contact probes 41 in the metal block 2 such that extremities of the retractable plungers 11, 12 are protruded from the upper and lower faces of the metal block 2. Each of the RF contact probes 41 is identical with that shown in FIG. 1B. The RF signal contact probe 41 is retained within the insertion hole 21 formed in the metal block 2 by the insulative substrate 31 (retainer) while forming a gap between the outer periphery of the contact probe 41 and the interior wall of the insertion hole 21. Thus, a coaxial structure of the predetermined characteristic impedance is achieved. A contact probe adjacent to the RF signal contact probe 41 is an earth probe 42, wherein the metal pipe 13 shown in FIG. 1B is fitted directly within the insertion hole of the metal block 2. A guide plate 43 for positioning an IC is placed on the upper surface of the insulative substrate 31 and fixed to the insulative substrate 31 along with the metal block 2 by screws 44. The lower insulative substrate 31 in the drawing is also fixed to the metal block 2 by screws 45. Reference numeral 46 designates positioning pins used for fixing the IC socket to the wiring board 5.

Figure 7A:
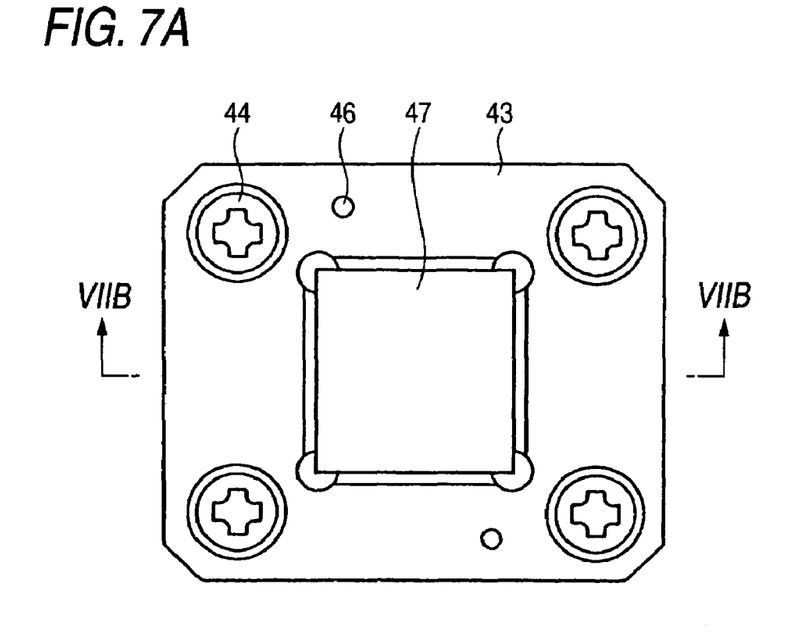
FIG. 7A is a plan view of the inspection unit, showing a state that an inspected IC is mounted thereon.
Figure 7B:
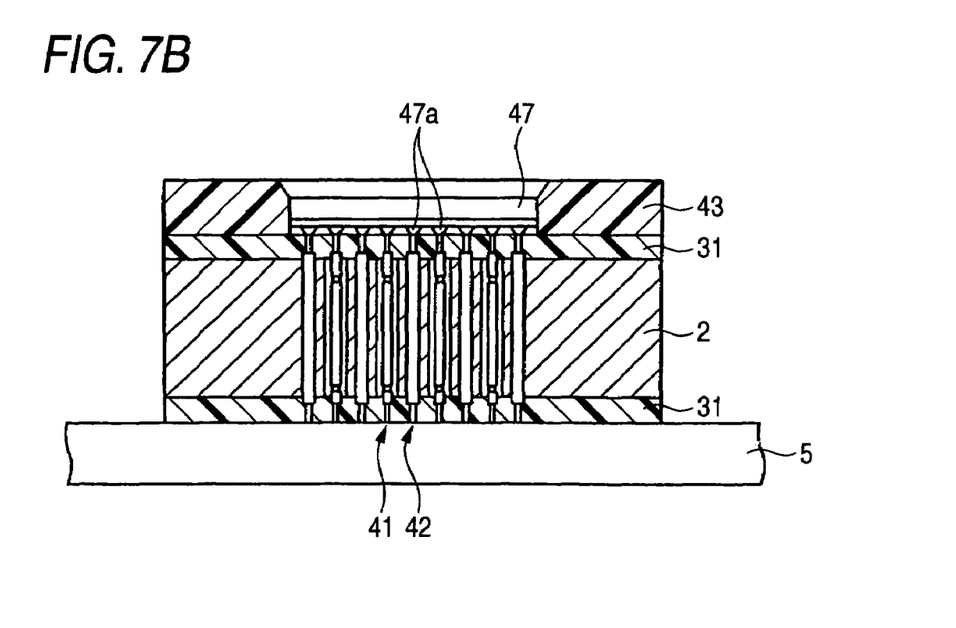
FIG. 7B is a section view taken along a line VIIB-VIIB of FIG. 7A.

As shown in FIG. 7B, the IC socket is fixed on the wiring board 5 through use of the positioning pins 46, whereupon the plungers 12 located on the lower parts of the contact probes 41 are retracted. As a result, the wiring board 5 and the insulative substrate 31 are brought into contact with each other and fastened together by unillustrated screws. Further, when an IC 47 is inserted and pressed against a recessed section 43a (see FIG. 6B) of an upper guide plate 43, the corresponding upper plunger 11 is also depressed.

By upward driving force of the spring 14 provided in the contact probe 1 (see FIG. 1B), one of electrode terminals 47a of the IC 47 is tightly, electrically connected with the plunger 11 of the contact probe 1. The IC is eventually connected to the inspection equipment connected to the wiring board 5, thereby enabling inspection of an electrical characteristic of the IC. Incidentally, the RF signal contact probe 41 connected to an RF electrode terminal of the IC 47 is embodied as the coaxial probe 41. Hence, impedance matching is achieved between the IC 47 and the wiring board 5, and hence the IC 47 can be inspected accurately without loss.

When the plurality of electrode terminals of the IC 47 are connected with the wiring board 5 by way of the IC socket, the wiring board 5 is constituted into a multilayer structure. Further, wiring is formed such that respective wiring patterns assume specific impedance of 50 Ω or the like.

The invention is also applicable to another inspection unit such as the inspection jig shown in FIG. 8. Even when an IC is for high-frequency, high-speed purposes and the electrode terminals are formed at a very small pitch, the IC can be inspected very stably through use of the coaxial cable of the present invention without involving attenuation of a signal.

In the case of the above IC socket, the retractable plungers are provided at both ends of each contact probe. However, in a case where one of the ends is always fixed on the wiring board, the plunger at the one end may be omitted, and substituted by fixing means such as soldering. That is, the retractable plunger may be provided at the other end of the contact probe which is to be brought into contact with the inspected device.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An inspection coaxial probe comprising:
   a conductive block, formed with a first face, a second face opposed to the first face and a penetration hole connecting the first face and the second face;
   a first conductive plate, formed with a first recess and a first through hole communicated with the first recess and provided on the first face of the block;
   a contract probe, comprising:
      a conductive pipe; and
      a conductive plunger, retractably provided at a first end of the pipe and adapted to be brought into contact with a device to be inspected; and
      a first insulative spacer formed with a second recess and a second through hole communicated with the second recess,
      wherein the first insulative spacer is inserted into the first recess;
      wherein the first end of the pipe is fitted into the second recess, such that the contact probe is coaxially retained in the first through hole, the second through hole and the penetration hole of the block and a part of an outer periphery of the pipe directly faces an interior wall of the penetration hole while forming an air gap therebetween; and
   wherein an inner diameter of the first recess is larger than an inner diameter of the penetration hole.

2. The inspection coaxial probe as set forth in claim 1, further comprising:
   a second conductive plate, formed with a third recess and a third through hole communicated with the third recess, and provided on the second face of the block and; and
   a second insulative spacer formed with a fourth recess and a fourth through hole communicated with the fourth recess,
   wherein the second insulative spacer is inserted into the third recess;
   wherein a second end of the pipe is fitted into the fourth recess, such that the contact probe is coaxially retained in the third through hole and the fourth through hole;
   wherein the contact probe is adapted to be electrically connected to a wiring board on which an inspection circuit is provided via the second end of the pipe; and
   wherein an inner diameter of the third recess is larger than the inner diameter of the penetration hole.

* * * * *